US009739909B2

(12) United States Patent
Vanier et al.

(10) Patent No.: US 9,739,909 B2
(45) Date of Patent: Aug. 22, 2017

(54) HIGHLY REFLECTIVE CRYSTALLINE COLLOIDAL ARRAYS WITH RADIATION ABSORBING PARTICLES

(71) Applicant: PPG Industries Ohio, Inc., Cleveland, OH (US)

(72) Inventors: Noel R. Vanier, Wexford, PA (US); John T. Donnelly, Monroeville, PA (US); Xiangling Xu, Pittsburgh, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

(21) Appl. No.: 14/346,563

(22) PCT Filed: Mar. 1, 2013

(86) PCT No.: PCT/US2013/028600
§ 371 (c)(1),
(2) Date: Mar. 21, 2014

(87) PCT Pub. No.: WO2014/046723
PCT Pub. Date: Mar. 27, 2014

(65) Prior Publication Data
US 2015/0205010 A1 Jul. 23, 2015

Related U.S. Application Data

(63) Continuation-in-part of application No. PCT/US2012/056907, filed on Sep. 24, 2012.

(60) Provisional application No. 61/538,293, filed on Sep. 23, 2011.

(51) Int. Cl.
| | |
|---|---|
| G02B 1/02 | (2006.01) |
| G02B 5/26 | (2006.01) |
| C09D 5/33 | (2006.01) |
| C09C 1/28 | (2006.01) |
| C30B 7/00 | (2006.01) |
| C30B 29/16 | (2006.01) |
| C30B 29/54 | (2006.01) |
| C30B 29/60 | (2006.01) |
| G02B 5/22 | (2006.01) |

(52) U.S. Cl.
CPC .............. *G02B 1/02* (2013.01); *C09C 1/28* (2013.01); *C09D 5/004* (2013.01); *C30B 7/00* (2013.01); *C30B 29/16* (2013.01); *C30B 29/54* (2013.01); *C30B 29/60* (2013.01); *G02B 5/223* (2013.01); *G02B 5/26* (2013.01)

(58) Field of Classification Search
CPC ............. G02B 1/02; G02B 5/26; G02B 5/223
USPC ........................................ 252/586; 523/200
See application file for complete search history.

(56) References Cited

U.S. PATENT DOCUMENTS

| | | | |
|---|---|---|---|
| 7,903,339 B2 | 3/2011 | Banerjee et al. | |
| 8,641,933 B2* | 2/2014 | Purdy | B82Y 20/00 |
| | | | 250/201.1 |
| 2007/0100026 A1* | 5/2007 | Munro | C08F 257/02 |
| | | | 523/200 |
| 2008/0112909 A1* | 5/2008 | Faler | A61K 8/11 |
| | | | 424/61 |
| 2009/0133605 A1 | 5/2009 | Butler et al. | |
| 2009/0153953 A1 | 6/2009 | Banerjee et al. | |
| 2010/0315703 A1 | 12/2010 | Purdy et al. | |
| 2011/0014366 A1 | 1/2011 | Nogueira et al. | |
| 2011/0091658 A1 | 4/2011 | Banerjee et al. | |
| 2011/0128616 A1 | 6/2011 | Banerjee et al. | |
| 2011/0134515 A1 | 6/2011 | Banerjee et al. | |

FOREIGN PATENT DOCUMENTS

| | | |
|---|---|---|
| EP | 1818373 A2 | 8/2007 |
| JP | 201184689 A | 4/2011 |
| RU | 2009114163 A | 10/2010 |
| WO | 2008/141973 A1 | 11/2008 |
| WO | WO 2010/147793 A1 | 12/2010 |

OTHER PUBLICATIONS

He et al., "Morphology Control of Hollow Polymer Latex Particle Preparation", Journal of Applied Polymer Science, 2005, 860-863, vol. 98.
McDonald et al., "Emulsion Polymerization of Voided Particles by Encapsulation of a Nonsolvent", Macromolecules, 2000, 1593-1605, vol. 33.
Nguyen et al., "Polymer-TiO2 Composite Nanorattles via RAFT-Mediated Emulsion Polymerization", Journal of Polymer Science Part A: Polymer Chemistry, 2011, 1-7.
Pavlyuchenko et al., "Hollow-Particle Latexes: Preparation and Properties", Journal of Polymer Science: Part A: Polymer Chemistry, 2001,1435-1449, vol. 39.
Xu et al., "Synthesis and Utilization of Monodisperse Hollow Polymeric Particles in Photonic Crystals", J. Am. Chem. Soc., 2004, 7940-7945, vol. 126.
Yuan et al., "Preparation of Monodispersed Hollow Polymer Particles by Seeded Emulsion Polymerization under Low Emulsifier Conditions", Journal of Applied Polymer Science, 2005, 1505-1510, vol. 98.
Zhang et al., "Fabrication of Order Porous Polymer Film via a One-Step Strategy and Its Formation Mechinism", Macromolecules, 2009, 3591-3597, vol. 42.

* cited by examiner

*Primary Examiner* — Monique Peets
(74) *Attorney, Agent, or Firm* — Julie W. Meder (57) ABSTRACT

A radiation-scattering composition, comprising a plurality of colloidal crystals or aggregates of colloidal crystals, each said crystal comprising radiation reflecting particles in a colloidal array and radiation absorbing particles dispersed in the crystals. The composition scatters radiation in a wavelength band in substantially all directions and absorbs radiation.

19 Claims, 5 Drawing Sheets

HIGHLY REFLECTIVE CRYSTALLINE COLLOIDAL ARRAYS WITH RADIATION ABSORBING PARTICLES

RELATED APPLICATION

This application is a continuation-in-part of International Patent Application No. PCT/US2012/056907 filed Sep. 24, 2012, which claims priority to U.S. Provisional Patent Application No. 61/538,293 filed Sep. 23, 2011.

FIELD OF THE INVENTION

This invention relates to crystalline colloidal arrays used as radiation-scattering materials. In particular, this invention relates to crystalline colloidal arrays provided as randomly-oriented, low aspect ratio crystals.

BACKGROUND OF THE INVENTION

Crystalline colloidal arrays have been used for a variety of purposes. A crystalline colloidal array (CCA) is a three-dimensional ordered array, typically produced from monodispersed colloidal particles, which may be composed of inorganic or organic materials. Such CCAs are often provided in a hexagonal close-packed (HCP) or random hexagonal close-packed (RHCP) structure, exhibiting a layered structure with a preferred diffraction axis that is perpendicular to the layers in the structure. The diffraction wavelength varies with the angle of incidence to these layers. When fixed in a binder as a colorant, such CCAs can diffract radiation in the visible spectrum. These colorant CCAs exhibit a goniochromatic effect when applied to a substrate.

When used in a film or coating, the CCAs typically are oriented predominately in a single direction, such as with the hexagonal planes of the CCAs positioned parallel to the surface of the film or substrate. More recently, CCAs have been used to create unique optical effects, such as for producing images or to function as sensors.

SUMMARY OF THE INVENTION

The present invention includes a radiation-scattering composition which includes a plurality of colloidal crystals. Each crystal comprises a colloidal array of particles. The composition scatters radiation over a wavelength band in substantially all directions. The present invention also includes a method of producing a radiation-scattering composition by producing a dispersion of charged monodispersed particles and then arranging the particles into periodic arrays to form a plurality of colloidal crystals. The crystals are dispersed into a carrier to produce a composition that scatters radiation in a wavelength band in substantially all directions.

The present invention further includes a composite radiation reflecting and absorbing composition, comprising a plurality of colloidal crystals, each crystal comprising radiation reflecting particles arranged in a colloidal array and radiation absorbing particles dispersed in the crystals. The composition scatters radiation in a wavelength band in substantially all directions and absorbs radiation in another wavelength band.

Also included is a method of producing a composite radiation reflecting and absorbing composition comprising: producing a dispersion comprising charged mondispersed first particles and second radiation absorbing particles; arranging the first particles into periodic arrays in which the second particles are randomly distributed, wherein each crystal scatters radiation by reflection from the first particles and absorbs radiation by the second particles; and dispersing the crystals in a carrier to produce a composition that scatters radiation in a wavelength band in substantially all directions and absorbs radiation in another wavelength band.

BRIEF DESCRIPTION OF THE DRAWINGS

FIG. 8 includes colored images of sprayed dried crystal aggregates coated onto an opacity chart, without nanoparticles (FIG. 8A) and with nanoparticles (FIG. 8B).

DETAILED DESCRIPTION OF THE INVENTION

For purposes of the following detailed description, it is to be understood that the invention may assume various alternative variations and step sequences, except where expressly specified to the contrary. Moreover, other than in any operating examples or where otherwise indicated, all numbers expressing, for example, quantities of ingredients used in the specification and claims are to be understood as being modified in all instances by the term "about." Accordingly, unless indicated to the contrary, the numerical parameters set forth in the following specification and attached claims are approximations that may vary depending upon the desired properties to be obtained by the present invention. At the very least, and not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements.

Also, it should be understood that any numerical range recited herein is intended to include all sub-ranges subsumed therein. For example, a range of "1 to 10" is intended to include all sub-ranges between (and including) the recited minimum value of 1 and the recited maximum value of 10, that is, having a minimum value equal to or greater than 1 and a maximum value of equal to or less than 10.

In this application, the use of the singular includes the plural and plural encompasses singular, unless specifically stated otherwise. In addition, in this application, the use of "or" means "and/or" unless specifically stated otherwise, even though "and/or" may be explicitly used in certain instances.

The term "polymer" is meant to include homopolymer, copolymer, and oligomer. The term "metal" includes metals, metal oxides, and metalloids. The term "infuse" and related terms (such as infusion) refer to penetration from a liquid phase.

The present invention includes CCAs particularly suited for use as pigment replacements, typically for replacement of white pigments such as $TiO_2$ or other colored pigments. If provided in film form on a substrate, the CCAs of the present invention may exhibit angle dependent optical effects. However, when, as in the present invention, such CCAs are dispersed randomly in a coating composition, such as in a film-forming composition, the coating composition diffracts radiation in substantially all directions in order to provide an optical effect that is visible to the human eye as a colorant and/or as an opacifying pigment. By scattering in substantially all directions it is meant that the crystals are not aligned or are substantially not aligned with each other and do not exhibit reflection in one direction. Instead, the crystals are randomly oriented such that reflection (scattering) occurs in many directions. The present invention is not limited to diffracting visible light. Other wavelengths of electromagnetic radiation outside the visible spectrum may be diffracted by the CCAs of the present invention such as ultraviolet or infrared radiation.

The term "wavelength" is meant to include a spectral band of electromagnetic radiation, unless specifically stated otherwise. For example, a reference to a wavelength of 600 nm may include 595 to 605 nm. Likewise, a wavelength band may be referred to by the color thereof, such as "red", meaning a wavelength band that exhibits a red color.

In one embodiment, the radiation scattering composition of the present invention includes a plurality of colloidal crystals, which may be provided as individual colloidal crystals (each crystal being an individual CCA that exhibits Bragg diffraction) or as crystal aggregates thereof. Except where clearly indicated to the contrary, the colloidal crystals and the crystal aggregates may be used interchangeably in the embodiments described herein. By crystal aggregates it is meant a set of individual crystals of a CCA, which may be referred to as crystal facets, and which each generally exhibit Bragg diffraction and are bound together. The crystals within each aggregate may be randomly arranged therein or they may be aligned along their respective crystal faces or a combination thereof. Each of the colloidal crystals (individual or in an aggregate) may include a face-centered cubic (FCC) structure, a simple cubic structure, and/or an HCP structure. By exhibiting Bragg diffraction, it is meant that the colloidal crystals diffract radiation according to Bragg's law. Parallel planes or layers formed by the ordered array of particles in the crystals interact with incident radiation in accordance with Bragg's law. Radiation striking the colloidal crystals is diffracted whereby radiation of the wavelength that meets the Bragg condition (the diffraction wavelength) is reflected by the planes of the particles while the remainder of the radiation is transmitted through the matrix as described in U.S. Pat. No. 6,894,086, incorporated herein by reference. In the visible spectrum, the diffracted light may be goniochromatic, i.e. the color of the reflected radiation may depend on the viewing angle. The wavelength of the diffraction of light at a given angle is proportional to the distance between the Bragg planes formed by the periodic array of particles, which is proportional to the particle diameter for HCP crystals and may be proportional to the particle diameter for FCC crystals and simple cubic crystals. The diffraction wavelength may be tuned to a desired wavelength band by various means such as by selecting the particle size (i.e., the distance between Bragg planes) and/or selecting materials for the colloidal crystal to alter the effective refractive index.

The diffraction wavelength also depends on the effective refractive index of the materials that compose the colloidal crystal. The effective refractive index of the colloidal crystal is closely approximated as a volume average of the refractive index of the materials of the colloidal crystal. The intensity of the diffracted radiation is dependent in part on the number of layers present in the crystal, with a greater number of layers producing higher diffraction intensity. The intensity of the diffracted radiation is also dependent on the difference in refractive index between the planes of the particles and the planes of the surrounding materials. Higher refractive index contrast between alternating planes or layers increases diffraction intensity.

Various compositions may be used for the particles, including but not limited to organic polymers such as polystyrene, polyurethane, acrylic polymers, alkyd polymers, polyesters, siloxane-containing polymers, polysulfides, epoxy-containing polymers and inorganic materials such as metal oxides (e.g. alumina, silica, zinc oxide, or titanium dioxide) or composites of these materials. The particles may be unitary (i.e. having a single composition). Alternatively, the particles may have a core-shell structure where the core may be produced from the same materials as the above-described unitary particles, as described in U.S. Pat. No. 8,133,938, incorporated herein by reference.

In one embodiment of the invention, the core is composed of a high refractive index material (e.g. over 1.65) such as $TiO_2$ or the like, such as ZnO, $ZrO_2$, PbO, ZrSi, $ZrSiO_4$, ZnS, or $ZnSe_2$ The high refractive index core may be surrounded by a polymeric shell produced from the above-described polymers. The shell may be produced from polymeric materials which are applied to the core particle (e.g. $TiO_2$) in multiple layers thereby creating a multi-layered polymeric shell surrounding a particle core. For example, $TiO_2$ particles (or other high refractive index inorganic particles) may be treated with an organic molecule that will bind to the $TiO_2$ to functionalize the surface of the particles with a functional group, such as an acrylic functional group. A polymer shell is produced by polymerizing monomers with the organic molecule functional group, optionally with a crosslinker and/or a free radical initiator. The shelling process may be repeated to achieve a desired diameter of the particles.

In another embodiment, the particle core may define one or more voids, which may be filled with air or other gas. Air-filled voids, having a low refractive index, may impart a relatively large refractive index contrast relative to the polymers of the shell and the remainder of the colloidal crystals. The voids in the particle cores may reduce the cost of materials and render the particles lighter weight. Voids may be produced in the particle cores by swelling, solvent encapsulation, etching, dissolution or the like. In one embodiment, the particles are sized about 200 nm in diameter.

In one embodiment, the colloidal crystals or crystal aggregates are provided as low aspect ratio structures, having an aspect ratio of less than 100 or less than 10 or less than 2. A plurality of colloidal crystals or crystal aggregates exhibiting varying diffraction wavelengths may be used in combination in a composition. For example, colloidal crystals that diffract radiation in wavelengths in the blue spectrum (reflecting blue colored light) may be used along with colloidal crystals that diffract radiation in the green spectrum (reflecting green light) and colloidal crystals that diffract radiation in the red spectrum (reflecting red light). By using these three types of crystals in combination (blue, green and red), a composition that contains these crystals may appear white. In this manner, a traditional white pigment such as $TiO_2$ may be replaced with a plurality of lower cost crystals exhibiting varying diffraction wavelengths.

By way of a non-limiting example, a composition that provides high hiding and/or appears white may include a first set of colloidal crystals or crystal aggregates that reflect in a band at 400 to 500 nm, a second set of colloidal crystals or crystal aggregates that reflect in a band at 500 to 600 nm, and a third set of colloidal crystals or crystal aggregates that reflect at 600 to 700 nm. The average of the percent reflectance at all wavelengths in each of the bands may be at least 50%, such that in combination, the three sets of colloidal crystals or crystal aggregates provide a high hiding and/or a white appearance. In one embodiment, these wavelength bands have a bandwidth at half height of less than 200 nm. Greater average reflectance such as at least 80% or over 90% by each set of crystals or aggregates may provide a brighter white appearance. Other sets of crystals or aggregates that reflect in other wavelength bands may be used as well to achieve broad band reflection and high hiding and/or a white appearance. Alternatively, colloidal crystals or crystal aggregates produced from larger particles having a primary diffraction in the infrared (IR) range (such as about 1200 nm), may be employed. The second order diffraction from these IR diffracting crystals may cover the entire visible spectrum.

By randomly orienting the colloidal crystals and crystal aggregates, especially those having an FCC structure, in a coating composition, broad band reflection is exhibited. In contrast to particulate material comprising CCAs as colorants in coating compositions applied to substrates wherein the CCAs are generally aligned along the long axes thereof with the substrate, the colloidal crystals and crystal aggregates of the present invention are randomly dispersed in a coating composition. The broad spectrum reflection achieved by using the crystals of the present invention in a coating composition may appear as a white color.

In one embodiment, the colloidal crystals and/or crystal aggregates are included in a carrier, such as a coating composition comprising a film-forming composition to provide hiding and/or color to the coating composition. The degree of reflection (i.e. the hiding ability) of the colloidal crystals of the present invention may be the same as or even surpass that of $TiO_2$. When used in a coating composition, the amount of $TiO_2$ in the crystals or aggregates of the present invention that is needed to achieve hiding may be less than the amount of $TiO_2$ conventionally used in a high hiding coating composition, thereby reducing the cost.

The colloidal crystals of the present invention may be produced by mixing samples of monodispersed oppositely charged (positively and negatively) particles that are sized so as to form a cubic crystalline structure such as those exhibited by KCl or NaCl. For example, similarly sized oppositely charged particles with similar refractive indices will form such a crystalline structure with desirable diffraction properties. The samples may contain similar or equal quantities of particles. By using particles that are similar or equal in size and/or having similar or equal refractive indices, the resulting crystals exhibit a degree of uniformity within each crystal. The particles may be produced from materials having the same or different refractive indices and/or being of the same or different sizes and still form a cubic crystal with desirable diffraction properties.

In one embodiment, the particles used in the colloidal crystals of the present invention are hollow particles, which may be produced by a solvent encapsulation or produced by swelling in an acid or a base. Solvent encapsulation involves an emulsion polymerization process that encapsulates a nonsolvent hydrocarbon for the polymer being formed. A low molecular weight polymer phase separates in a dispersed hydrocarbon-monomer mixture. After evaporation of the solvent, the resulting monodispersed particles may define a plurality of voids or a single void. A suitable process for producing hollow particles by solvent encapsulation is described in McDonald et al., *Macromolecules*, 2000, 33, 1593-1605.

Hollow particles may be prepared by swelling with an acid or base according to the process described in Pavlyuchenko et al., *Journal of Polymer Science*, Part A: Polymer Chemistry, Vol. 39, 1435-1449 (2001) and/or Cai-Deng Yuan et al., *Journal of Applied Polymer Science*, Vol. 98, 1505-1510 (2005). A core latex particle is encapsulated with at least one polymer shell. The particle is treated with a swelling component (e.g. an aqueous base) that expands both the core and shell. Upon drying and crosslinking the shell, the core shrinks to yield one or more voids within the crosslinked shell. In one embodiment, a seed core particle is encapsulated with at least three shells, and the seed core is subsequently neutralized with a swelling component (to produce an internal void) with crosslinking of at least one of the shells. The size of such multi-shelled hollow particles, and thus the diffraction wavelength of a colloidal crystal produced therefrom, may be controlled by the size of the original seed core particle and/or the thickness and quantity of shells. For example, smaller seed core particles result in smaller diameter hollow particles that, when arranged in a colloidal crystal, reflect at a shorter diffraction wavelength (e.g. blue light) while larger seed core particles may be used to produce larger hollow particles and colloidal crystals that reflect longer diffraction wavelengths such as green or red light, thereby providing for tuning of the diffraction wavelength of the colloidal crystals as described above.

For either type of hollow particle, an ionic monomer such as 4-styrenesulfonic acid sodium salt or a polymerisable surfactant such as SIPOMER® PAM 200 may be incorporated in the shell as necessary to promote self assembly by increasing the surface charge. Steric stabilizing groups such as obtained from polyethylene glycol (MPEG) containing acrylate monomers may be incorporated in the shell to stabilize the particles in an organic environment. These stabilizing groups should be of sufficient length and size to hinder particle-particle coagulation and be soluble or compatible with the solvent and organic material of a film-forming composition into which they will ultimately be received.

The dispersion of particles (hollow, core-shell or unitary) may be purified to remove excess raw material, by-products, solvents, and the like. Electrostatic repulsion of the charged particles causes the particles to align themselves into an ordered, packed array. By ordered, packed array, it is meant that the particles pack together and the particles are arranged in a regular structure (FCC, simple cubic, RHCP or HCP) and may touch each other.

In one embodiment, the dispersion of monodisperse particles may be assembled into an array by purifying the dispersion, applying the dispersion onto a substrate and drying the dispersion. The dispersion of particles applied to the substrate may contain 10-70 vol. % of charged particles or 30-65 vol. % of charged particles. The dispersion can be applied to the substrate by dipping, spraying, brushing, roll-coating, curtain coating, flow-coating, or die-coating to a desired thickness. The wet coating may have a thickness of 20-60 microns, such as 40 microns. Upon drying, the particles self-align into a CCA and diffract radiation accordingly. The CCA may be ground into crystals of a suitable size, such as less than 5 microns or about 2.5 microns for use in coating compositions or the like. Alternatively, the dried CCA may then be overcoated with a curable binder. Upon curing, the resulting material may be ground into aggregates of binder and CCA crystals of suitable size, such as less than 5 microns or about 2.5 microns for use in coating compositions or the like.

In another embodiment, a curable binder is added to the particle dispersion, which remains with the particles upon drying to form an aggregate of crystals. For example, a curable binder such as a water soluble low molecular weight acrylic polymer, oligomer, monomer or amino resin crosslinker and optionally a polyol may be dissolved in the particle dispersion at a concentration that will result in a volume ratio in the dispersion of cured polymer volume to the volume of particles of 0.1:7 or 0.5:7 or 2.5:7, up to at least 7:7. The resulting dispersions are dried, such as by spray drying, to produce crystal aggregates that include the particles arranged in crystals and the binder (cured polymer). The particle dispersions as above may also be drum dried or tray dried or be dried using a rotary evaporator to give assembled and cured crystal aggregates. The crystal aggregates of the present invention may be used as is or they may be ground to a suitable size, such as less than 5 microns or about 2.5 microns for use in coating compositions or the like.

Aggregates having a low volume ratio of cured polymer to particles (e.g. about 0.1:7 to 0.5:7) may not be completely interpenetrated with cured polymer. There may be voids in the interstices between particles. When such low polymer volume ratio crystal aggregates are included in a coating composition, some of the components of the coating composition may further interpenetrate the aggregates. As such, the polymer which is used to produce the aggregates (i.e., hold the particles within the aggregates in place) may function in the manner of a "glue" until the aggregates are included into a coating composition that more fully interpenetrates the aggregates. Alternatively, the colloidal particles may be assembled into a CCA without a binder and then are partially coalesced by heating to a carefully controlled temperature schedule. A partially coalesced CCA may still define interstitial voids that may be sealed and not interconnected. Such voids may result in a high refractive index contrast.

In another embodiment, radiation absorbing nanoparticles are included in the crystal aggregates of the present invention. By nanoparticles it is meant that the particles are sized less than 1 micron. The resultant crystal aggregates comprise a composite radiation reflecting and absorbing composition having colloidal arrays and radiation absorbing particles, which exhibits two optical effects, reflection of radiation from the particles in the colloidal arrays and absorption of radiation from the nanoparticles. In this manner, the composite crystal aggregates scatter radiation in one wavelength band and absorb radiation in another wavelength band. The radiation absorbing nanoparticles may be selected to absorb radiation in one or more wavelength bands while the colloidal arrays reflect radiation as described above. For example, the nanoparticles may absorb a broad band of visible radiation such that the composite crystal aggregates may appear dark colored while also reflecting visible radiation from the colloidal arrays, whereby the dark color of the nanoparticles functions as a "background" to the light reflected from the colloidal crystals. Suitable nanoparticles for including in the composite crystal aggregates of the present invention include materials that provide a dark colored background to the reflective crystal aggregates, such as dark colored pigments or dyes. Non-limiting examples of dark colored pigments include carbon black, iron oxide, or other red or blue pigments or the like, any of which provide a dark background to the reflection produced from the CCAs.

In certain instances, the crystal aggregates of the present invention not having the radiation absorbing particles are applied to a white or light-colored substrate, the reflected light is masked by the broad reflection of light from the substrate. This masking can be minimized using the composite crystal aggregates of the present invention. When the composite crystal aggregates (having the radiation absorbent particles) are coated onto a white or light-colored background that reflects in a broad wavelength band, the radiation absorbing particles function as a dark background that enhances the contrast, so that light reflected from the CCAs is visible. In this manner, the crystal aggregates may exhibit strong color even when coated over white or light-colored substrates. In other embodiments, the radiation absorbing nanoparticles may absorb sufficient light to function as a background to the reflection of light from the CCA particles, yet may not absorb radiation at wavelengths which appear dark. Other colors and hues of absorbed radiation are included in the present invention such that the wavelength of reflected radiation and the wavelength of absorbed radiation may be selected and coordinated as desired for a particular substrate.

In one embodiment, the radiation absorbing particles are randomly dispersed in the composite crystal aggregates, such as in the binder that receives the CCA particles. Such a structure may be produced by first dispersing the radiation absorbing particles in a medium such as water and mixing the dispersion of radiation absorbing particles with a dispersion of the particles that form the CCAs. Upon drying of the combined dispersions, such as by spray drying, the nanoparticles are randomly incorporated into the binder surrounding the particles in the CCA. In one embodiment, the dispersion of radiation absorbing particles contains little or no ionic material and the charge of the radiation absorbing particles is the same as that of the particles forming the CCAs, so that the inclusion of the dispersion of radiation absorbing particles does not interfere with the production of colloidal arrays.

Alternatively, the radiation absorbing particles may be incorporated into the particles themselves during synthesis of the particles. Pigments or dyes may be included as additives to the reaction mixture of components that form the particles of the CCA so that the pigment or dye is incorporated directly into the CCA particles. For organic dyes, it may be beneficial to first disperse or dissolve the organic dye in water, resulting in a nonionic dispersion or a solution of organic dye that may be added to the reaction mixture.

In one embodiment, the radiation absorbing particles comprise less than about 10 wt. % or less than about 1 wt. % of the composite aggregate crystals and have a particle size of less than 100 nm.

The following examples, some being prophetic, are intended to demonstrate the general principles of the present invention. The invention should not be considered as limited to the specific examples presented herein.

EXAMPLES

Example 1

A seed core particle latex was prepared as follows. Deionized (DI) water (1060 g) was first charged into a four-necked round bottom flask fitted with a thermocouple, mechanical stirrer, and condenser, and then heated up to 80° C. under an $N_2$ blanket. Once the temperature reached 80° C., a mixture of 3 g of ammonium persulfate and 36 g of DI water was charged into the flask and mixed for 15 minutes. Then, a pre-emulsion of 30 g of DI water, 5 g of Disponil FES 993 (an emulsifier, available from BASF) and 44 g of methyl methacrylate (MMA), was charged all at once into the flask and held at 80° C. for 30 minutes. After holding was completed, a pre-emulsion of 95 g of DI water, 1.05 g of SR 550 (methoxy polyethylene glycol (350) monomethacrylate, available from Sartomer), 3.15 g of Disponil A 1080 (a nonionic surfactant, available from BASF), 4.25 g of Disponil FES 993, 50.0 g of methacrylic acid (MAA) and 108 g of MMA, was charged into the flask over 3 hours. After the charge was completed, it was held at 80° C. for an additional 30 minutes before being cooled down to room temperature.

Example 2

Hollow latex particles were prepared using the seed core particles produced in Example 1 as follows. DI water (1398 g) was first charged into a four necked round bottom flask fitted with a thermocouple, mechanical stirrer, and condenser, and then heated up to 85° C. under an $N_2$ blanket. Once the temperature reached 85° C., a mixture of 2 g of ammonium persulfate and 87.0 g of DI water was charged into the flask, and then 430 g of the seed core latex of Example 13 was charged into the flask. The mixture was held at 77° C. for 10 minutes.

Three shells were formed over the seed particles by first charging into the flask (over 60 minutes) a first monomer charge of a pre-emulsion of 76.5 g of DI water, 1.80 g of sodium dodecylbenzenesulfonate (SDBS), 9.0 g of MAA, 60.0 g of MMA, 1.5 g of divinyl benzene (DVB) and 84.0 g of styrene Immediately after the first monomer charge was completed, a second monomer charge of a pre-emulsion of 303.0 g of DI water, 2.25 g of ammonium persulfate, 3.3 g of SDBS, 12.0 g of MAA, 3.0 g of DVB and 600.0 g of styrene, was charged over 90 minutes into the flask. After that, the mixture was heated up to 90° C., and held at 90° C. for 15 minutes. After holding, a third monomer charge of a pre-emulsion of 90.0 g of DI water, 0.9 g of SDBS, 0.6 g of sodium styrene sulfonate, 90.0 g of DVB and 75.0 g of styrene, was charged into the flask over 10 minutes.

Figure 1:
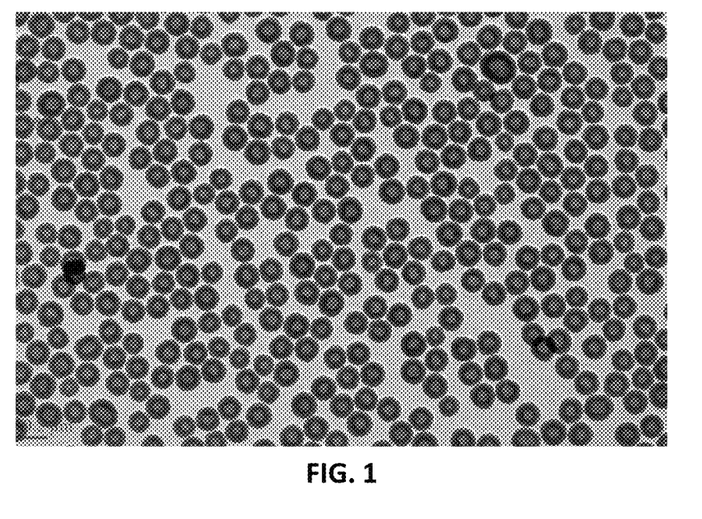
FIG. 1 is a transmission electron microscope (TEM) image of hollow particles produced according to one embodiment of the present invention.

The seed core and first shell were swollen by neutralization with a base. A mixture of 37.5 g of 30% ammonia solution and 161.0 g of DI water was charged into the flask over 15 minutes, and held at 90° C. for 45 minutes to swell the seed core and shells of the latex particles. The latex was cooled down to 77° C., and a mixture of 3.0 g of t-butyl hydroperoxide (70%) and 21.0 g of DI water was charged into the flask all at once. A mixture of 3.0 g of ascorbic acid and 90.0 g of DI water was then charged over 15 minutes to polymerize the styrene in the shells. The latex was then held at 77° C. for 30 minutes before being cooled to room temperature, yielding a latex dispersion of 210 nm polymer particles with a 101 nm hollow core. A TEM image of those hollow particles is shown in FIG. 1.

The latex dispersion was then ultrafiltered using a 4-inch ultrafiltration housing with a 2.41-inch polyvinylidine fluoride membrane, both from PTI Advanced Filtration, Inc., Oxnard, Calif., and pumped using a peristaltic pump at a flow rate of approximately 170 ml per second. DI water (2985 g) was added to the dispersion after 3000 g of ultrafiltrate had been removed. This exchange was repeated several times until 11349 g of ultrafiltrate had been replaced with 11348 g DI water. Additional ultrafiltrate was then removed until the solids content of the mixture was 36-38 percent by weight.

Example 3

Figure 4:
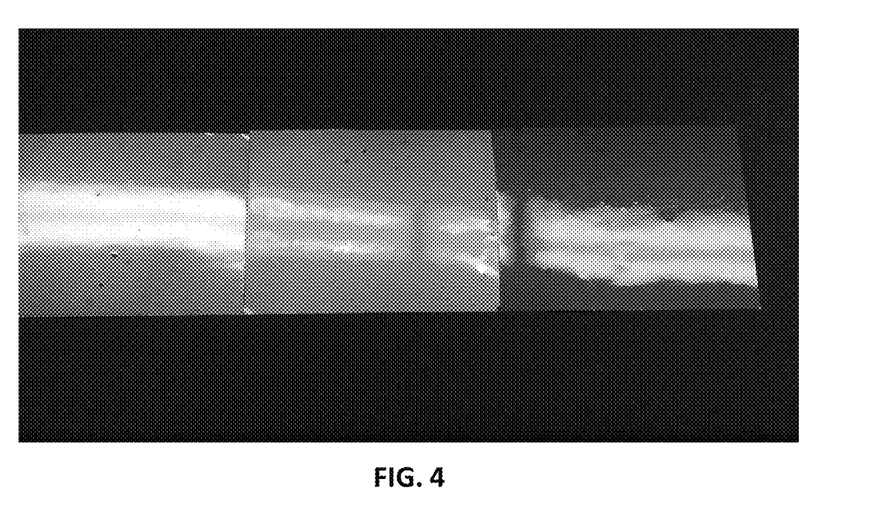
FIG. 4 is a set of colored images of the hollow particles show in FIGS. 1-3 drawn down and overcoated with a UV coating, appearing red, green and blue, from left to right.

A portion of the dispersion of Example 2 was drawn down onto a substrate and overcoated with a UV curable monomer (SR9003, a propoxylated neopentyl glycol diacrylate, available from Sartomer) and cured. The cured material exhibited a blue face diffraction color (as shown in the right hand sample in FIG. 4, with the white lines appearing in the middle of each of the three samples in FIG. 4 due to the reflection of overhead lamps) and a normal dramatic blue to black shift as the angle of incidence was decreased.

A 2% mixture of CYMEL® 385 (a high imino methylated melamine resin produced by Cytec Industries, Inc.) was added to the latex dispersion (30% solids) which was then spray dried using a Buchi B290 spray drier to produce a powder of crystal aggregates. The flow was set at 40%, the inlet temperature was 155° C. (nozzle cooling on) and the outlet temperature was 72° C. The aspirator was at 70% and the pump ranged from 6-14% with the pressure maintained at −40 millibar. A sample of the collected powder (0.3 g) was dispersed in CYMEL® 385 (1.5 g in 1.5 g water) with a trace of phenyl acid phosphate catalyst and drawn down on a black BYK opacity chart. The coating was cured at 90° C. for 30 minutes to produce a bluish-green color.

Example 4

Figure 2:
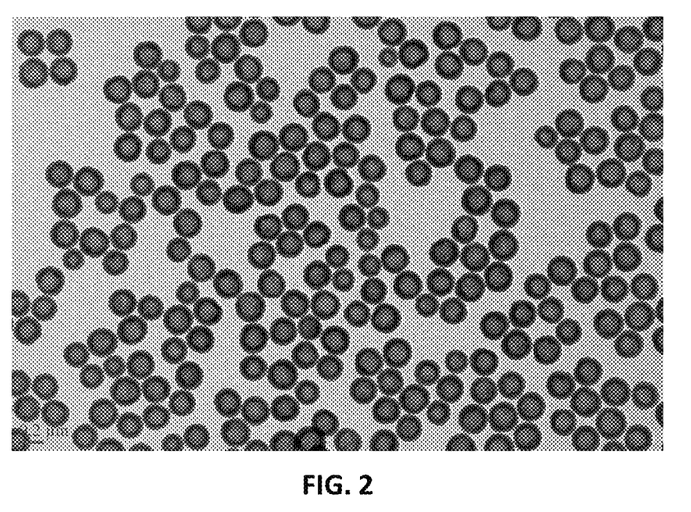
FIG. 2 is a TEM image of hollow particles produced according to another embodiment of the present invention.

A batch of 238 nm polymer particles with 154 nm hollow cores was produced following Example 1 and 2, except that 4 g of Disponil FES 993 was used in the first pre-emulsion as described in Example 1. A TEM image of those hollow particles is shown in FIG. 2. When drawn down onto a substrate and overcoated with UV curable monomer (Sartomer SR9003) and cured, the cured material exhibited a green face diffraction color (as shown in the middle sample of FIG. 4) and a normal dramatic green to blue shift as the angle of incidence was decreased. This second latex dispersion was spray dried to produce crystal aggregates, and Cymel 385 binder was added at 1%. A sample of the collected powder (0.3 g) was dispersed in Cymel 385 (1.5 g in 1.5 g water) with a trace of phenyl acid phosphate catalyst and drawn down on a black BYK opacity chart. The coating was cured at 90° C. for 30 minutes to produce a strong bluish-green color.

Example 5

Figure 3:
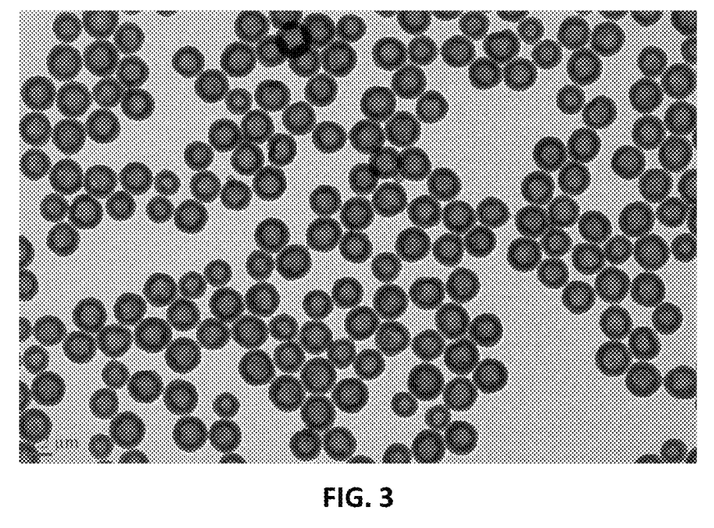
FIG. 3 is a TEM image of hollow particles produced according to another embodiment of the present invention.

A batch of 270 nm polymer particles with 170 nm hollow cores was produced following Examples 1 and 2, except that 3.0 g of Disponil FES 993 was used in the first pre-emulsion as described in Example 1. A TEM image of those hollow particles is shown in FIG. 3. When drawn down onto a substrate and overcoated with UV curable monomer (Sartomer SR9003) and cured, the cured material exhibited a red face diffraction color (as shown in the left hand sample in FIG. 4) and a normal dramatic red to green shift as the angle of incidence was decreased. This third latex was spray dried to produce crystal aggregates, and Cymel 385 binder was added at 1%. A sample of the collected powder (0.3 g) was dispersed in Cymel 385 (1.5 g in 1.5 g water) with a trace of phenyl acid phosphate catalyst and drawn down on a black BYK opacity chart. The coating was cured at 90° C. for 30 minutes to produce a pink color.

Figure 5:
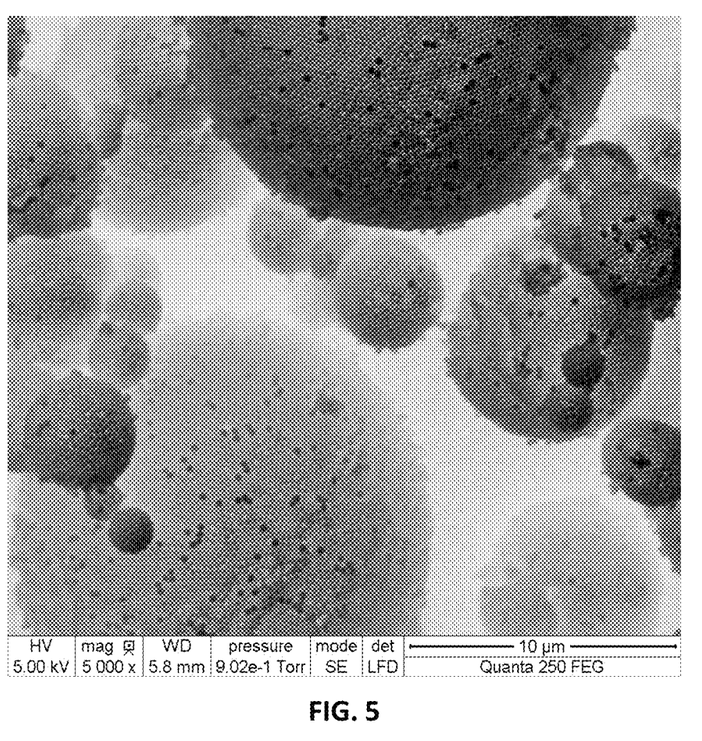
FIG. 5 is a scanning electron microscope (SEM) image of crystal aggregates produced according to one embodiment of the present invention.

An SEM image of the spray dried "red" crystal aggregates is reproduced in FIG. 5. Regions of colloidal crystals are seen as facets on the exposed surfaces of the aggregates, evidenced by the regular ordering of the latex particles.

Example 6

Figure 6:
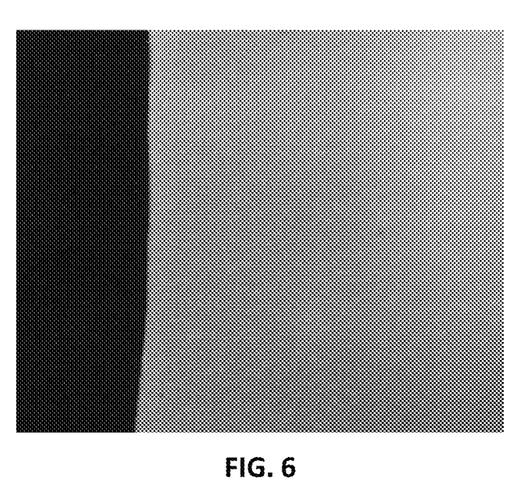
FIG. 6 is an image of an off-white coating composition produced according to the present invention.

A coating with a mixture of the three samples of spray dried crystal aggregates from Examples 3, 4, and 5 in the ratio 1:2:3 was drawn down in a coating composition as in Examples 3-5, producing an off-white coating with hiding as shown in FIG. 6.

Example 7

Monodisperse hollow latex particles were prepared by solvent encapsulation as follows. A seed core particle latex was first prepared as follows. DI water (700 g), 6 g of sodium lauryl sulfate and 0.848 g of sodium bicarbonate were first charged into a four-necked round bottom flask fitted with a thermocouple, mechanical stirrer, and condenser, and then heated to 80° C. under an $N_2$ blanket. Once temperature reached 80° C., 5% of a pre-emulsion of 164 g of styrene, 8 g of acrylic acid, 0.5 g of sodium lauryl sulfate, 60 g of DI water and 17.2 g of tert-dodecyl mercaptan were charged into the flask, and mixed for 20 minutes. Then the rest of the pre-emulsion mixture was fed into the flask over 1 hour at 80° C. After feed was complete, the reaction mixture was held for 1 hour before cooling down to room temperature.

Figure 7:
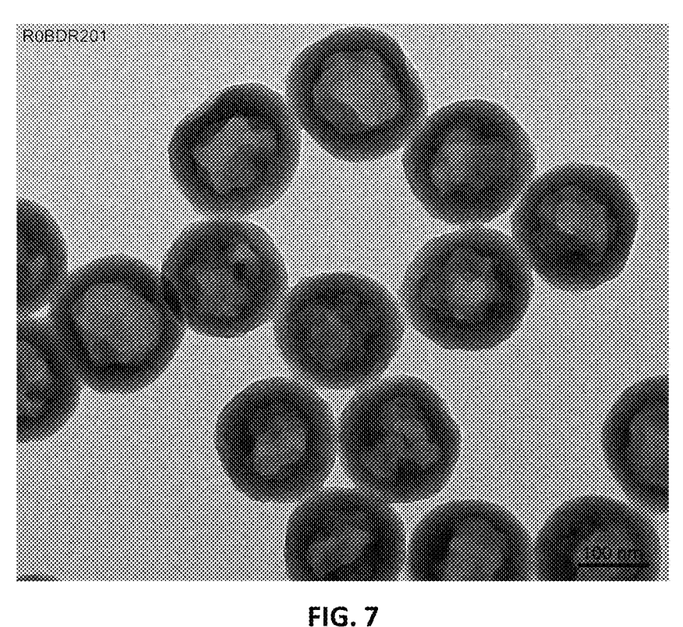
FIG. 7 is a TEM image of hollow particles produced according to another embodiment of the present invention.

Polymer particles with solvent encapsulated in the cores were prepared as follows with the above-described seed core particle latex. DI water (471.5 g), 189.5 g of methanol, 2.07 g of DOWFAX® 8390 (an anionic surfactant available from Dow Chemicals), 1.0 g of DOWFAX® 2A1 (an anionic surfactant available from Dow Chemicals), 6.55 g of tert-dodecyl mercaptan and 12.6 g of the seed core particle latex were charged into a four-necked round bottom flask fitted with a thermocouple, mechanical stirrer, and condenser, and then heated up to 70° C. Once the temperature reached 70° C., a mixture of 112.5 g of styrene, 100 g of isooctane and 18.5 g of methacrylic acid were charged into the flask at one time and then the mixture was held at 70° C. for 30 minutes. After holding, a mixture of 5 g of DI water and 5.24 g of ammonium persulfate was added into the flask at one time, and then held at 70° C. for 1 hour. After holding was complete, a mixture of 192.5 g of styrene, 26.5 g of divinyl benzene and 34.0 g of isooctane were fed into the flask over 3 hours at 70° C. Then the mixture was held at 70° C. for 1 hour before cooling to room temperature, yielding a latex dispersion of 185 nm polymer particles with 108 nm hollow cores. A TEM image of these hollow particles is shown in FIG. 7.

Example 8

An aqueous dispersion of monodisperse or sufficiently monodisperse $TiO_2$ particles (or other high refractive index inorganic particles) with an average particle diameter of 130 nm (average diameter may be 80-220 nm) may be treated with 3-(trimethoxysilyl)propyl methacrylate or other organic molecules that will bind to the $TiO_2$ to functionalize the surface of the particles. The dispersion will be heated to 80° C., and a styrene emulsion sufficient to coat the particles with a 5 nm thick shell and containing 5% DVB as a crosslinker will be added along with a low level of potassium persulfate as a free radical initiator. After polymerization of this styrene/DVB shell on the particles is complete, the shelling process will be repeated. A thick shell of polymer will be built up on the particles until the particle diameter is 250 nm. This process will be repeated to make monodisperse particles with average diameters in the 170 to 300 nm range. Other high refractive index core particle materials such as $ZrO_2$, ZnO or ZnS with diameters of 80 to 180 nm will be coated to form composite core-shell particles as described above.

Example 9

The dispersions of Examples 2, 4, 5, 7 and 8 will be dried via each of a drum dryer, tray dryer and rotary evaporator to give assembled and cured crystal aggregates. Cured polymer volumes may be used at ratios of 2.5:7.5 to 6:4.

A portion of the particle dispersions of Example 2 was assembled into crystalline colloidal arrays by drying on a PET substrate to form an approximately 10 μm thick film. The film was further overcoated with 50% Cymel 385 aqueous solution with a trace of phenyl acid phosphate catalyst. The film was then dried at room temperature, and then baked at 90° C. for 1 hour to give a CCA film which diffracted a blue color.

Example 10

The particle dispersions of Examples 2, 4, 5, 7 and 8 will be assembled into crystalline colloidal arrays by drying. A curable water soluble low molecular weight acrylic polymer containing multiple ketone groups and a water soluble dihydrazide crosslinker molecule will be dissolved in the dispersions of the examples at a concentration that will result in a volume ratio of cured polymer volume to the volume of particles of 3:7 in the dispersion. The resulting dispersions will be spray dried to give assembled and cured crystal aggregates.

The dispersions as above will also be dried via each of a drum dryer, tray dryer and rotary evaporator to give assembled and cured crystal aggregates. Cured polymer volumes may be used at ratios of 2.5:7.5 to 6:4.

Example 11

The particle dispersions of Examples 2, 4, 5, 7 and 8 will be assembled into crystalline colloidal arrays by drying. A curable water soluble amino resin crosslinker or low molecular weight amino resin such as CYMEL® 385 (a high imino methylated melamine resin produced by Cytec Industries, Inc.) or CYMEL® 1172 (glycoluric crosslinker), optionally with a diol or polyol, will be dissolved in the dispersions of the examples at a concentration that will result in a volume ratio of cured polymer volume to the volume of particles of 3:7 in the dispersion. The resulting dispersions will be spray dried to give assembled and cured crystal aggregates.

The dispersions as above will also be dried via each of a drum dryer, tray dryer and rotary evaporator to give assembled and cured crystal aggregates. Cured polymer volumes may be used at ratios of 2.5:7.5 to 6:4.

Example 12

The particle dispersions of Examples 2, 4, 5, 7 and 8 will be assembled into crystalline colloidal arrays by drying. A mixture of water soluble acrylic monomers and oligomers including at least one di, tri or tetra acrylate as a crosslinker and a low temperature free radical initiator such as 4,4'-azobis(4-cyanovaleric acid) will be dissolved in the dispersions of the examples at a concentration that will result in a volume ratio of cured polymer volume to the volume of particles of 3:7 in the dispersion. Alternatively, in place of the free radical initiator a photoinitiator may be incorporated and the system cured by exposure to ultraviolet radiation. The resulting dispersions will be spray dried to give assembled and cured crystal aggregates.

The dispersions as above will also be dried via each of a drum dryer, tray dryer and rotary evaporator to give assembled and cured crystal aggregates. Cured polymer volumes may be used at ratios of 2.5:7.5 to 6:4.

For example, 5 g of the particle dispersion prepared in Example 5 was mixed with 1.8 g SR 610 (polyethylene glycol (600) diacrylate, available from Sartomer) and 0.05 g of diphenyl(2,4,6-trimethylbenzoyl)phosphine oxide/2-hydroxy-2-methyl-propiophenone (from Aldrich), and then dried at room temperature on PET substrate to form an approximately 10 μm thick film. After that, the film was cured with an LED UV light for 1 minute under an $N_2$ blanket. A red film was produced.

Example 13

To the particle dispersions of Examples 2, 4, 5, 7 and 8 will be added a monomer mixture containing styrene, butyl acrylate and a 2% ethyleneglycol dimethacrylate in a 1:7 to 6:4 volume ratio to the particles along with potassium persulfate initiator at 80° C. A low Tg polymer shell will be formed on the particles. This shell may seal porosity in the shell particularly after heat treatment. The resulting dispersions will be spray dried to give assembled and coalesced, partially coalesced or bonded crystal aggregates.

The dispersions as above will also be dried by each of a drum dryer, tray dryer and rotary evaporator to give assembled and partially coalesced or bonded crystal aggregates.

For example, 2000 g of the latex prepared in Example 2 (without ultrafiltration) was charged into to a four-necked round bottom flask fitted with a thermocouple, mechanical stirrer, and condenser, and then heated up to 77° C. under an $N_2$ blanket. Once temperature reached 77° C., a preemulsion of 150 g of DI water, 1.5 g of ammonium persulfate, 0.45 g of sodium dodecylbenzenesulfonate (SDBS), 0.6 g of sodium styrene sulfonate, 50 g of styrene, 25 g of butyl acrylate and 50 g of MMA was charged into the flask over 45 minutes. After the charge was completed, the latex was then held at 77° C. for 60 minutes before cooling to room temperature.

Example 14

The particle dispersions of Examples 2, 4, 5, 7 and 8 will be transferred to solvent by, for example, adding Dowanol PM Acetate (DPMA) solvent and distilling off the water. To these non-aqueous dispersions stabilized by the steric stabilizing groups on the particle shells will be added solvent soluble non-ionic polymer matrix monomers, oligomers or polymers such as isocyanate/polyol, UV curable monomers, melamine/polyol or thermoplastic polymer. Evaporation of the solvent and curing as in Examples 9 to 13 will produce crystalline arrays filled with polymer matrix.

For example, 400 g of latex prepared in Example 2 was charged into a flask equipped with vacuum distillation. The mixture was heated up to 40° C., and 68 g of water was first stripped under 24.5 in Hg vacuum. After that, 600 g of DPMA was charged into the flask all at once. A further 338 g of solvent was stripped under vacuum. In this way, polymer particles were transferred from water to DPMA.

Example 15

The assembled, filled and cured crystal aggregates of Examples 9 to 14 will be milled to an average particle size of 2.5 microns, though average sizes in the range of 1-5 microns may be employed. Crystal aggregates of colloidal crystals with primary diffraction in the red spectrum will be mixed in a coating with appropriate quantities of crystal aggregates with green diffraction and crystal aggregates with blue diffraction to produce a white coating. The average particle size and the optimum ratio of particles with different wavelength diffraction will be varied to produce optimum whiteness and hiding. These coatings will be made with particles made by wet milling, dry milling and jet milling.

Example 16

The crystal aggregates of Examples 9 to 14 which have predominantly cubic or FCC structure will be milled to an average particle size of 2.5 microns. Each of these materials will be mixed in a coating formulation and used as a color pigment to give an intense color. Mixtures of these pigments will also be used to give additional colors. For example, a blue diffracting crystal aggregate will be mixed with a red diffracting crystal aggregate to give a magenta color.

Example 17

To the dispersions of Examples 2, 4, 5, 7 and 8, 1% of fine carbon black dispersion will be added prior to forming crystal aggregates as in Examples 9 to 14. These examples will be treated as in Example 16 to give intensely colored hiding pigments. In another example, Sudan Black dye will be incorporated in the organic shells of the dispersions. Each of these examples will be mixed in a coating formulation and coated as a color pigment to give an intense color. Mixtures of these pigments will also be used to give additional color in coatings.

Example 18 A and B

In each of Examples 18 A and B, dispersions of core-three shell particles were produced according to the method of Example 2, except that 342 g of the seed core latex was used. The dispersions (30% solids, with 2% Cymel 385 added as a binder) were spray dried with a Buchi 290 spray dryer with nozzle cooling on, an inlet temperature of 170° C., an outlet temperature of 80° C. and a pressure of −50 mbar to produce spray dried particles.

Figure 8A:
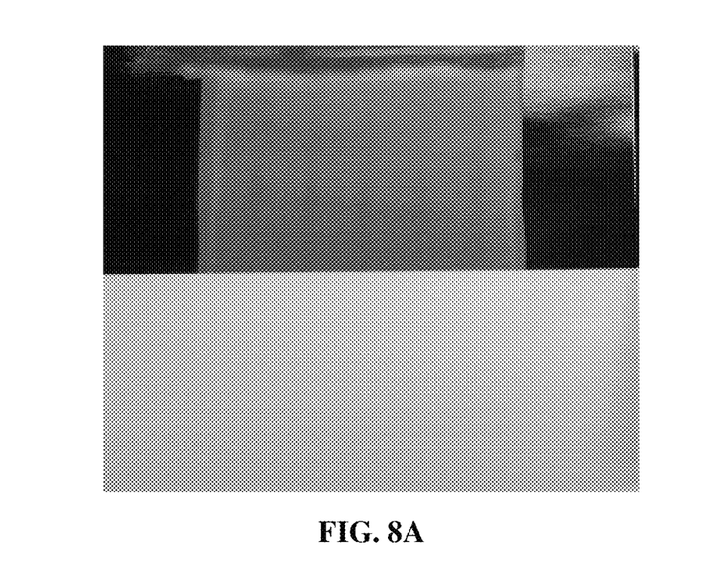

As a control, in Example 18A, the spray dried particles (0.5 g) were dispersed in 2 g of Cymel 385 melamine and 2 g of DI water and 2 drops of PAP (phenyl acid phosphate) acid catalyst. The dispersion of spray dried particles was drawn down on a Leneta Form 2C Opacity chart to make a coating and then cured at 90° C. for 30 minutes. This coating appeared greenish blue over the black background and essentially colorless over the white background (FIG. 8A).

Figure 8B:
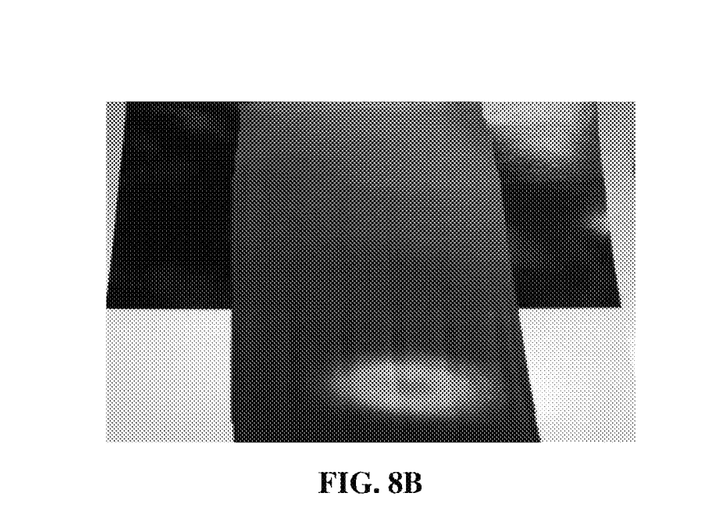

In Example 18B, to the dispersion of spray dried particles of Example 18A (spray dried particles in Cymel 385) was added Penn Color black Aqualour dispersion 36B165 (a non-ionic carbon black dispersion) at 3.7% on a solids weight basis. The combined dispersion of spray dried particles and carbon black was spray dried as above. The spray dried material was coated onto Leneta paper as in Example 18A. Unlike in Example 18A, the coating appeared dark green over both the black and the white backgrounds (FIG. 8B).

For comparison, a coating of the carbon black dispersion only (no colloidal dispersion) at the same concentration was applied to Leneta paper and appeared black over the black background and dark grey over the white background, indicating that the coating of Example 18B reflects radiation as in Example 18A as well as absorbs radiation.

Whereas particular embodiments of this invention have been described above for purposes of illustration, it will be evident to those skilled in the art that numerous variations of the details of the present invention may be made without departing from the invention as defined in the appended claims.

The invention claimed is:

1. A composite radiation reflecting and absorbing composition, comprising:
a plurality of colloidal crystals, each said crystal comprising (1) radiation reflecting first particles arranged in a colloidal array and (2) radiation absorbing second particles dispersed in said crystals, such that said composition scatters radiation in a wavelength band in substantially all directions and absorbs radiation in another wavelength band.

2. The composite radiation reflecting and absorbing composition of claim 1, wherein said plurality of colloidal crystals are provided as aggregates of said crystals.

3. The composite composition of claim 2, wherein said aggregates further comprise a binder.

4. The composite composition of claim 2, wherein said radiation absorbing particles are dispersed in said binder.

5. The composite composition of claim 4, wherein said radiation absorbing particles comprise a dark-colored pigment or dye.

6. The composite composition of claim 5, wherein said dark-colored pigment particles comprise carbon black or iron dioxide.

7. The composite composition of claim 1, wherein said radiation absorbing particles comprise less than 10 wt. % of said crystal.

8. The composite composition of claim 7, wherein said radiation absorbing particles comprise less than 1 wt. % of said crystals.

9. The composite composition of claim 1, wherein said radiation absorbing particles are sized less than 100nm.

10. The composite composition of claim 1, wherein said radiation reflecting particles are core-shell particles.

11. The composite composition of claim 1, further comprising a film-forming composition.

12. A method of producing a composite radiation reflecting and absorbing composition comprising:
producing a dispersion comprising charged monodispersed first particles and second radiation absorbing particles;
arranging the first particles into periodic arrays to form a plurality of colloidal crystals in which the second particles are randomly distributed, wherein each crystal scatters radiation by reflection from the first particles and absorbs radiation by the second particles; and
dispersing the crystals in a carrier to produce a composition that scatters radiation in a wavelength band in substantially all directions and absorbs radiation in another wavelength band.

13. The method of claim 12, wherein the first particles are charged and the second particles are uncharged or have the same charge as the first particles.

14. The method of claim 12, further comprising dispersing the first particles in a first dispersion, dispersing the second particles in a second dispersion, and combining the first and second dispersions.

15. The method of claim 12, further comprising spray drying the crystals dispersed in a binder to produce aggregates of crystals and binder.

16. The method of claim 13, wherein the first particles are core-shell particles and wherein the cores of the first particles define voids.

17. The method of claim 16, wherein the second particles are received within the first particles.

18. The method of claim 12, wherein the second particles are randomly dispersed in the crystals.

19. A reflective coating composition comprising the composite composition of claim 1 and a film-forming composition.

* * * * *